United States Patent
Halter et al.

(10) Patent No.: US 7,777,509 B2
(45) Date of Patent: Aug. 17, 2010

(54) METHOD AND APPARATUS FOR ELECTRICAL TESTING

(75) Inventors: David E. Halter, Austin, TX (US); Michael P. Baker, Round Rock, TX (US); Samuel G. Stephens, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/109,964

(22) Filed: Apr. 25, 2008

(65) Prior Publication Data

US 2009/0267624 A1    Oct. 29, 2009

(51) Int. Cl.
*G01R 31/02* (2006.01)
*G01R 31/26* (2006.01)

(52) U.S. Cl. .................. 324/754; 324/755; 324/761; 324/762; 324/765

(58) Field of Classification Search .......... 324/754–765
See application file for complete search history.

(56) References Cited

U.S. PATENT DOCUMENTS

| | | | |
|---|---|---|---|
| 3,477,024 A | 11/1969 | Pelta | |
| 3,681,979 A | 8/1972 | Hammond Jr. | |
| 4,764,723 A * | 8/1988 | Strid | 324/765 |
| 5,550,480 A * | 8/1996 | Nelson et al. | 324/754 |
| 5,646,542 A | 7/1997 | Zamborelli et al. | |
| 5,903,143 A * | 5/1999 | Mochizuki et al. | 324/72.5 |
| 5,963,045 A * | 10/1999 | Zink et al. | 324/754 |
| 6,362,614 B2 * | 3/2002 | Draving | 324/72.5 |
| 6,362,635 B2 | 3/2002 | Draving et al. | |
| 6,617,864 B2 * | 9/2003 | Inoue et al. | 324/754 |
| 6,930,564 B2 | 8/2005 | Verspecht | |
| 6,933,713 B2 | 8/2005 | Cannon | |
| 6,956,362 B1 | 10/2005 | Campbell et al. | |
| 2008/0042678 A1 * | 2/2008 | Hayden et al. | 324/758 |

OTHER PUBLICATIONS

PCI Express Standard; "Base Specification Revision 2.0"; Dec. 2006.

* cited by examiner

*Primary Examiner*—Ha Tran T Nguyen
*Assistant Examiner*—Emily Y Chan
(74) *Attorney, Agent, or Firm*—Susan C. Hill (57) ABSTRACT

A test apparatus and device under test has a probe that can be located very close to contact pads and that requires very few solder connections. In addition, the probe can be configured to meet any appropriate and desired electrical specification while still using a same circuit board. There is no need to attach discrete components to a circuit board. Thus, by using a configurable probe, a single circuit board may be used with multiple probes or a reconfigurable probe to test for compliance with a variety of different electrical specifications having different requirements.

19 Claims, 4 Drawing Sheets

METHOD AND APPARATUS FOR ELECTRICAL TESTING

BACKGROUND

1. Field

This disclosure relates generally to electrical testing, and more specifically, to a method and apparatus for electrical testing.

2. Related Art

A wide variety of electrical standards require that certain electrical specifications be met in order for a device to be compliant with that particular electrical standard. For example, a high speed bus may require that AC timing and voltage parameters must be measured using a specified compliance load and from a measurement point within a very small and predetermined distance from the device under test. As one possible specific example, the PCI Express Base Specification (Revision 2.0 dated Dec. 20, 2006) requires that a specific compliance load (i.e. a 50 ohm resistor and a predetermined capacitance) be used when measuring AC timing and voltage parameters. In addition, the PCI Express Base Specification requires the measurement point to be within 0.2 inches (approximately 5.08 millimeters) of the package pins of the device under test. Requiring the measurement point to be so close to the package pins of the device under test, while also requiring that a specified compliance load be used, often results in the necessity to force a probe into areas that are too small or too tangled with wires for accurate measurements to be taken.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
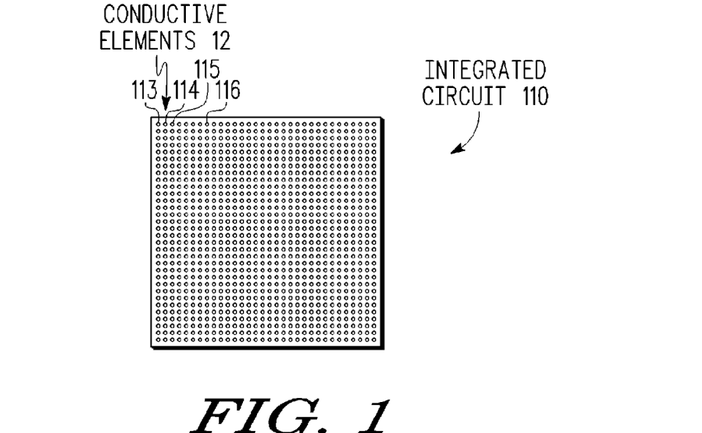
FIG. 1 illustrates a bottom view of an integrated circuit in accordance with one exemplary embodiment.

FIG. 1 illustrates a bottom view of an integrated circuit 110 having a 32×32 array of conductive elements 12 (e.g. land grid array, ball grid array, etc.) which may be used to make electrical contact to circuitry (not shown) on the integrated circuit 110. Alternate embodiments of integrated circuit 110 may instead use different types of packaging and connectivity, such as, for example, plastic leaded chip carrier, quad flat packs, thin small outline packages, etc. Note that the present invention may be used with any appropriate and desired packaging and interconnect technology. In addition, the conductive elements 12 used to make electrical contact with the circuitry within an integrated circuit 110 may be arranged in any desired or appropriate manner. The 32×32 array of conductive elements 12 illustrated in FIG. 1 is just one possible example. The purpose of FIG. 1 is to illustrate the scale and tiny dimensions that must be handled by electrical testing apparatus. As technology advances, the pitch between the conductive elements 12 on an integrated circuit 110 will get even smaller and more difficult for electrical testing apparatus to handle. In the illustrated embodiment, conductive elements 12 include conductive elements 113-116.

Figure 2:
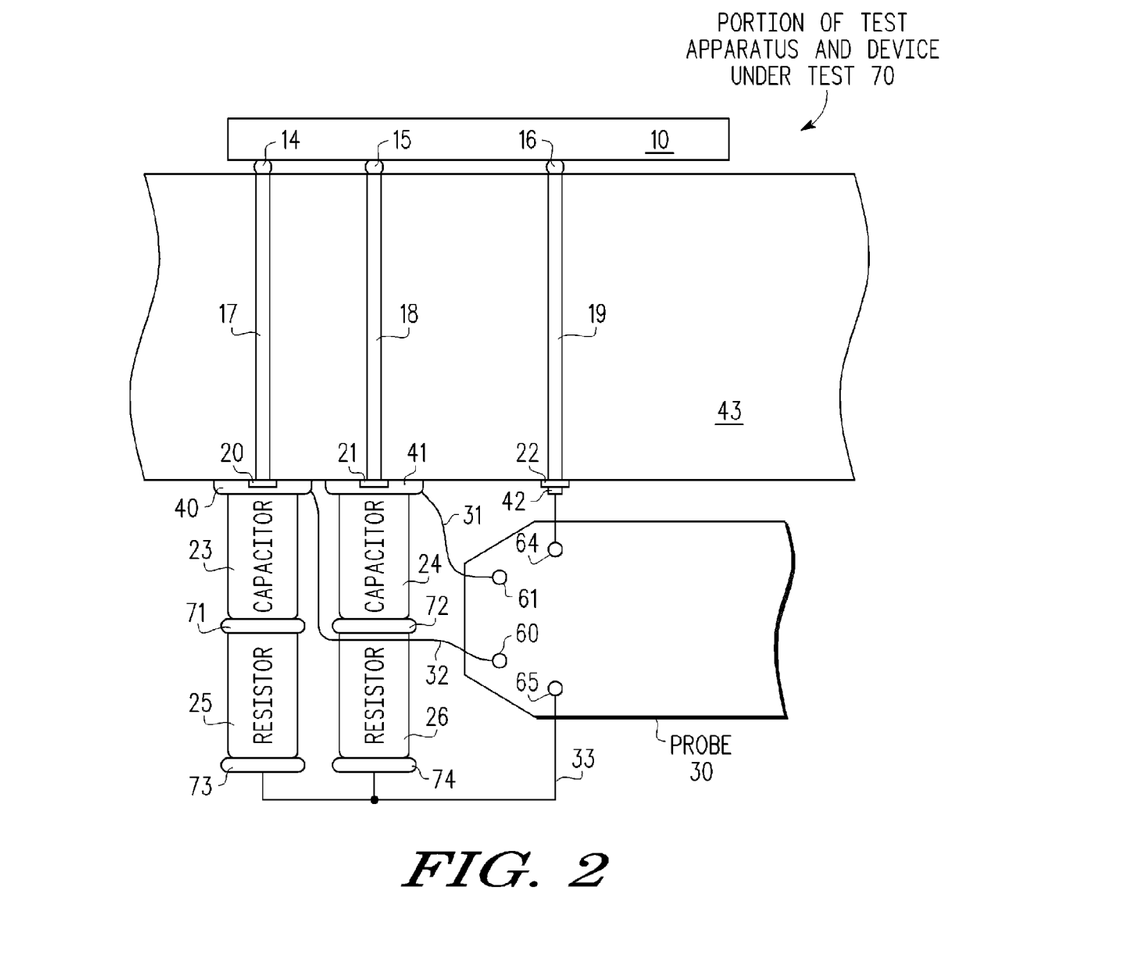
FIG. 2 illustrates one view of a portion of a test apparatus and a device under test in accordance with one exemplary embodiment.

FIG. 2 illustrates one view of a test apparatus and device under test 70 in accordance with one exemplary embodiment. Note that unlike FIG. 1, FIG. 2 is not drawn to scale. If FIG. 2 was drawn to scale, conductive pads 20 and 21 would be less than 1 millimeter apart. In the illustrated embodiment, device under test 10 is electrically coupled to circuit board 43 by way of conductive elements 14-16. Conductive element 14 is electrically coupled to conductive pad 20 by way of via 17; conductive element 15 is electrically coupled to conductive pad 21 by way of via 18; and, conductive element 16 is electrically coupled to conductive pad 22 by way of via 19. In one embodiment, device under test 10 may be implemented using integrated circuit 110 of FIG. 1. In alternate embodiments, device under test 10 may be any desired and appropriate device.

However, there are a wide variety of electrical standards that require that different electrical specifications be met in order for a device to be compliant with that particular electrical standard. For example, a high speed bus may require that AC timing and voltage parameters must be measured using a specified compliance load and from a measurement point within a very small and predetermined distance from the device under test. As one possible specific example, the PCI Express Base Specification (Revision 2.0 dated Dec. 20, 2006) requires that a specific compliance load (i.e. a 50 ohm resistor and a predetermined capacitance) be used when measuring AC timing and voltage parameters. In addition, the PCI Express Base Specification requires the measurement point to be within 0.2 inches (approximately 5.08 millimeters) of the package pins of the device under test. Thus, in order to meet the requirement for the specified load, it is necessary to coupled capacitor 23 to pad 20 by way of solder 40. Similarly, capacitor 24 is coupled to pad 21 by way of solder 41. However, the PCI Express Base Specification also required a resistance in series with the capacitance. Thus, it is necessary to couple resistor 25 to capacitor 23 by way of solder 71, and to couple resistor 26 to capacitor 24 by way of solder 72. Probe contact 65 and 64 are electrically coupled to each other and to resistor 25 by way of solder 73, to resistor 26 by way of solder 74, and to conductive pad 22 by way of solder 42. Note that via 19 is grounded by way of a ground plane (not shown) in circuit board 43, and thus probe contacts 64 and 65 are also grounded.

Note that soldering capacitors 23 and 24 to the conductive pads 20 and 21, respectively, is a very difficult task due to the pitch and size of conductive pads 20 and 21 and due to the large size of discrete capacitors 23 and 24. It is also very difficult to solder resistors 25 and 26 without heating and unintentionally re-flowing the solder between the capacitors 23, 24 and the pads 20, 21, respectively. And yet again, it is very difficult to solder the wire 33 to resistors 25, 26 without heating and unintentionally re-flowing the solder connections 71, 72, 40, 41. In addition, even more fragile and difficult to form solder connections are required. For example, wire 32 must be soldered to pad 20 by way of solder 40 in order to electrically couple probe contact 60 within the required 0.2 inches distance as required by the PCI Express Base Specification. However, this heating of solder 40 may damage any one or more of solder joints 40, 41, 71, 72, 73, or 74. Also, wire 31 must be soldered to pad 21 by way of solder 41 in order to electrically couple probe contact 61 within the required 0.2 inches distance as required by the PCI Express Base Specification. However, this heating of solder 41 may damage any one or more of solder joints 40, 41, 71, 72, 73, or 74.

In addition, it is important that the length of wires 31 and 32 be approximately the same so that there is very little differential timing skew between the signals transferred across wires 31 and 32. Because of the inductance introduced by the grounded wire 33, it is important to minimize the length of wire 33. This requires probe 30 to be as close as possible to capacitors 23, 24 and resistors 25, 26. However, such close proximity of probe 30 makes soldering to probe contacts 60, 61, 64, and 65 extremely difficult. In addition, some integrated circuits 10 have a large number of circuit board pads (e.g. 30 or more pads like contact pads 20 and 21) that must be soldered in the same slow, painstaking manner. The difficulty in soldering such small, closely spaced stacked components becomes prohibitive as the dimensions of integrated circuits and device components shrink.

Figure 5:
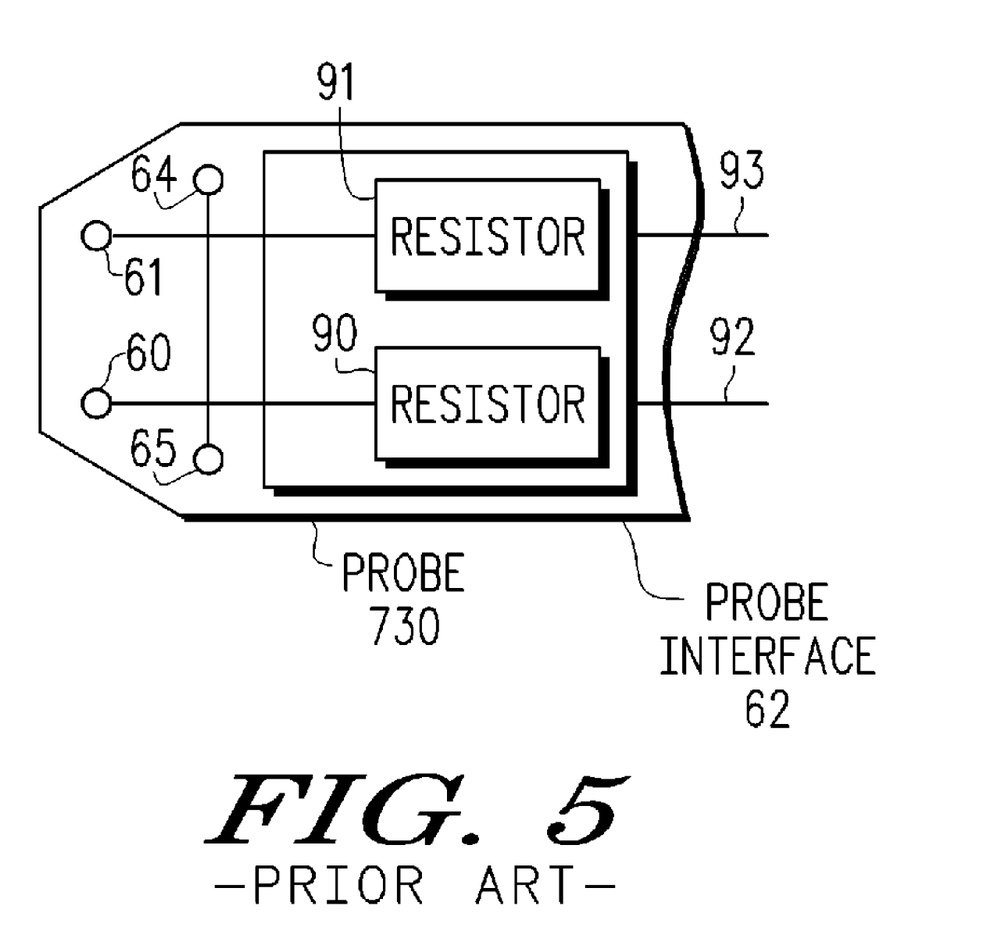
FIG. 5 illustrates one view of a probe in accordance with the prior art.

In one embodiment of FIG. 2, probe 30 may be implemented using a prior art probe 730 (see prior art FIG. 5). In this embodiment, referring to prior art FIG. 5, probe 730 has a probe interface 62 which includes a resistor 90 coupled in series between probe contact 60 and conductor 92. Probe interface 62 also includes a resistor 91 coupled in series between probe contact 61 and conductor 93. Resistor 90 is used in conjunction with the impedance of conductor 92 to achieve a desired impedance value (as viewed from probe contact 60) for the benefit of a test apparatus (not shown) coupled to probe 30. Similarly, resistor 91 is used in conjunction with the impedance of conductor 93 to achieve a desired impedance value (as viewed from probe contact 61) for the benefit of a test apparatus (not shown) coupled to probe 730. Note that neither resistor 90 nor resistor 91 can be used as part of the compliance load required by the PCI Express Base Specification.

Figure 3:
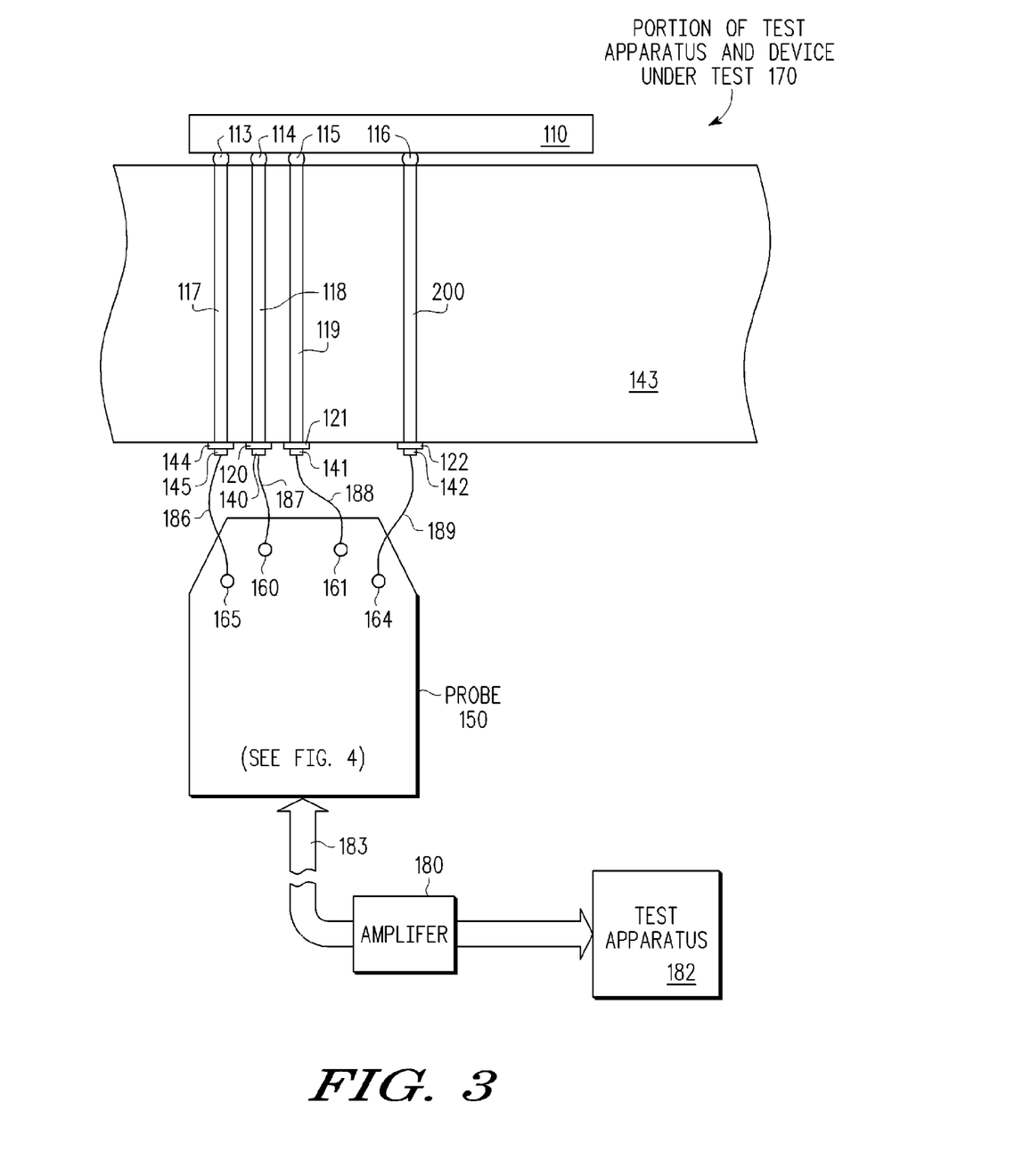
FIG. 3 illustrates one view of a portion of a test apparatus and a device under test in accordance with one exemplary embodiment.

FIG. 3 illustrates one view of a portion of test apparatus and device under test 170 in accordance with one embodiment. In the illustrated embodiment, device under test 110 is electrically coupled to circuit board 143 by way of conductive elements 113-116. Conductive element 113 is electrically coupled to conductive pad 144 by way of via 117; conductive element 114 is electrically coupled to conductive pad 120 by way of via 118; conductive element 115 is electrically coupled to conductive pad 121 by way of via 119; and, conductive element 116 is electrically coupled to conductive pad 122 by way of via 200. In alternate embodiments, the device under test 110 may be any type of device; the integrated circuit illustrated in FIG. 1 is just one possible example of a device under test 110.

There are a wide variety of electrical standards which require that different electrical specifications be met in order for a device to be compliant with that particular electrical standard. For example, a high speed bus may require that AC timing and voltage parameters must be measured using a specified compliance load and from a measurement point within a very small and predetermined distance from the device under test. As one possible specific example, the PCI Express Base Specification (Revision 2.0 dated Dec. 20, 2006) requires that a specific compliance load (i.e. a 50 ohm resistor and a predetermined capacitance) be used when measuring AC timing and voltage parameters. In addition, the PCI Express Base Specification requires the measurement point (e.g. probe contacts 160, 161, 164, 165) to be within 0.2 inches (approximately 5.08 millimeters) of the package pins (e.g. 113-116) of the device under test (e.g. 110).

Figure 4:
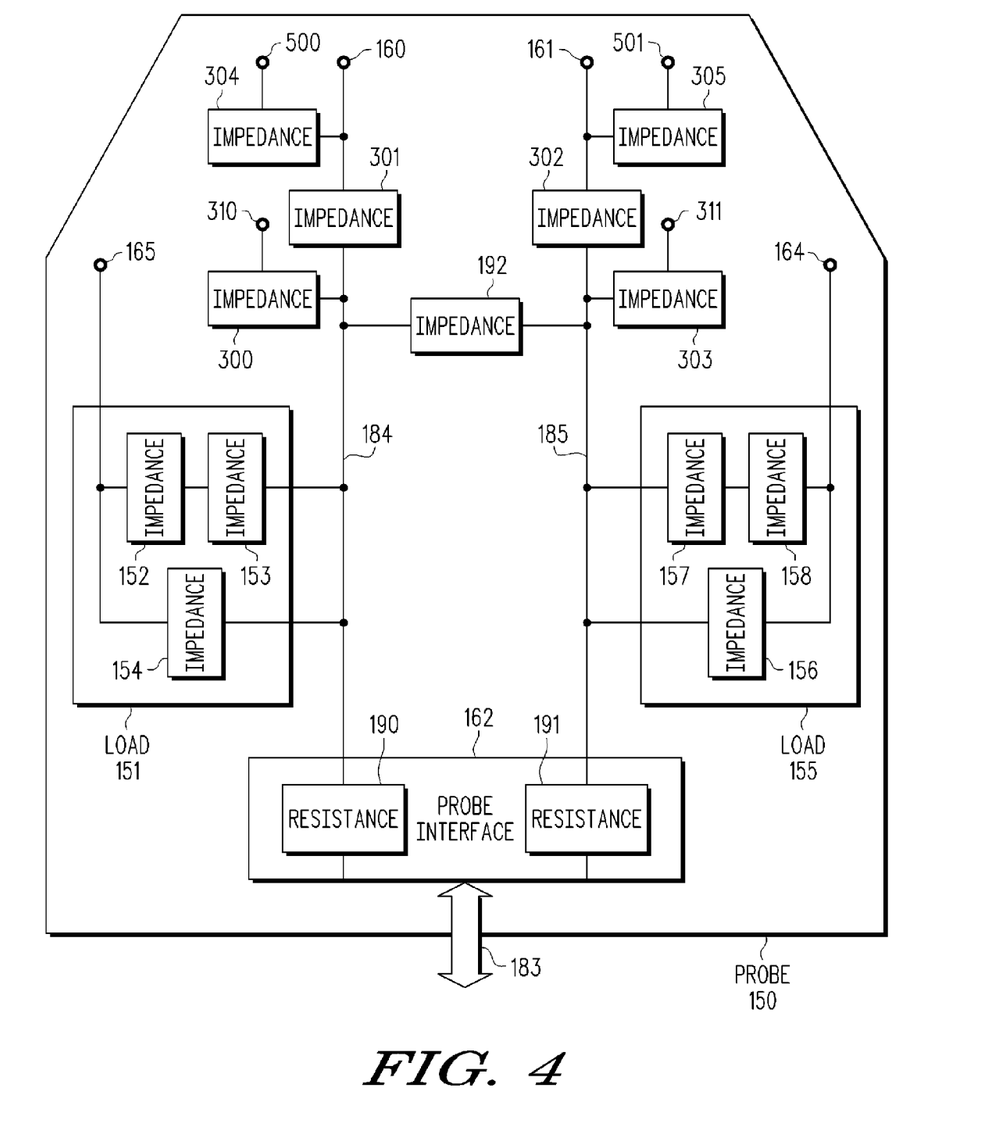
FIG. 4 illustrates one view of a probe of FIG. 3 in accordance with one exemplary embodiment.

Referring to both FIGS. 3 and 4, in order to meet the requirements for the compliance load for the PCI Express Base Specification, capacitor 154 and resistor 153 have been coupled to pad 120 by way of solder 140, conductor 187, probe contact 160, and conductor 184. The other terminal of capacitor 154 and resistor 153 is coupled to reference voltage 165. In addition, capacitor 157 and resistor 158 have been coupled to pad 121 by way of solder 141, conductor 188, probe contact 161, and conductor 185. The other terminal of capacitor 157 and resistor 158 is coupled to reference voltage 164. For the PCI Express Base Specification, voltage references 165 and 164 are electrically coupled to approximately ground (e.g. by way of vias 117 and 200, respectively). Note that vias 117 and 200 may be grounded by way of a ground plane (not shown) in circuit board 143, and thus probe contacts 164 and 165 may also be grounded.

Note that since the bulky discrete resistors (e.g. 25, 26 of FIG. 2) and capacitors (e.g. 23, 24 of FIG. 2) are no longer needed, the probe 150 may be coupled to pads 120, 121, 122, and 144 much, much more easily with many fewer solder connections. It is thus much easier to meet the PCI Express Base Specification requirement that the measurement point (i.e. probe contacts 160, 161) be within 0.2 inches (approximately 5.08 millimeters) of the package pins (e.g. 114, 116) of the device under test (e.g. 110).

Referring to FIG. 3, conductors 183 may be used to electrically couple probe 150 to amplifier 180. Amplifier 180 may also be coupled to a test apparatus 182. In various embodiment, test apparatus 182 may be an oscilloscope, a bit error rate tester, a pattern generator, a pulse generator, a radio frequency (RF) source, or any other desired or appropriate type of electrical device or circuitry. Some embodiments may use an amplifier 180 between probe 150 and test apparatus 182. Alternate embodiments may not use an amplifier 180. Also, in alternate embodiments, probe 150 may have any appropriate and desired number of probe contacts (e.g. 160, 161, 164, 165).

In alternate embodiments, apparatus 170 may have any appropriate and desired number of conductive elements (e.g. 113-116), any appropriate and desired number of vias (e.g. 117-119, 200), any appropriate and desired number of conductive pads (e.g. 120-122, 144), any appropriate and desired number of solder connections (e.g. 140-142, 145), and any appropriate and desired number of wires or interconnect wires (e.g. 186-189). Thus in alternate embodiments, any desired electrical signal on device under test 110 may be routed from the device under test 110 to probe 150 by way of a path such as 114, 118, 120, 140, 187, 160. Alternate embodiments may have fewer, more, or different conductive portions in the conductive path between device under test 110 and probe 150. Conductive portions 114, 118, 120, 140, 187, and 160 are merely intended as one of a wide variety of possible embodiments. In addition, in an alternate embodiment, some probe contacts (e.g. 164, 165) may be coupled to the same signal on device 110, either by way of the same conductive path (e.g. 116, 200, 122, 142, 189), or by way of different conductive paths that are electrically coupled on device 110 (e.g. both conductive paths are coupled to a ground node or ground plane on device 110).

FIG. 4 illustrates one view of a probe 150 of FIG. 3 in accordance with one embodiment. Although probe 150 was illustrated in FIG. 3 as being coupled in a configuration that complied with the PCI Express Base Specification, alternate embodiments of probe 150 may be used to meet different standard specifications other than the PCI Express Base Specification. Alternately, other embodiments of probe 150 may be used to meet any desired and appropriate electrical specification. Note that alternate embodiments of probe 150 may implement any one or more of impedances 152-154, 156-158, 300-305, and/or 190-192, depending upon the compliance load required by a particular specification or depending upon any one or more desired electrical characteristics required by a particular specification.

Note that in one embodiment of probe 150, resistor 190 is used in conjunction with the impedance of one of conductors 183 (see FIG. 3) to achieve a desired impedance value as viewed from probe contact 160. Similarly, resistor 191 is used in conjunction with the impedance of a different one of conductors 183 to achieve a desired impedance value as viewed from probe contact 161. In one embodiment, resistors 190 and 191 may be implemented as part of a probe interface 162. In alternate embodiments, probe interface 162 may comprise additional circuitry (not shown) for interfacing probe 150 to test apparatus 182.

Still referring to FIG. 4, in one embodiment, a load 151 may be coupled between a probe contact 165 and a conductor 184 on probe 150. Load 151 may comprise any one or more series or parallel coupled circuit elements. For example, one or more impedances 152 and/or 153 may be coupled in series between probe contact 165 and conductor 184. In addition, one or more impedances 154 may be coupled in parallel with one or more impedances 152 and/or 153. Impedance 152 may comprise one or more resistive elements, one or more capacitive elements, and/or one or more inductive elements; impedance 153 may comprise one or more resistive elements, one or more capacitive elements, and/or one or more inductive elements; and impedance 154 may comprise one or more resistive elements, one or more capacitive elements, and/or one or more inductive elements.

Similarly, in one embodiment, a load 155 may be coupled between a probe contact 164 and a conductor 185 on probe 150. Load 155 may comprise any one or more series or parallel coupled circuit elements. For example, one or more impedances 157 and/or 158 may be coupled in series between probe contact 164 and conductor 185. In addition, one or more impedances 156 may be coupled in parallel with one or more impedances 157 and/or 158. Impedance 157 may comprise one or more resistive elements, one or more capacitive elements, and/or one or more inductive elements; impedance 158 may comprise one or more resistive elements, one or more capacitive elements, and/or one or more inductive elements; and impedance 156 may comprise one or more resistive elements, one or more capacitive elements, and/or one or more inductive elements.

Alternate embodiments may use load 151 and not load 155, may use load 155 and not load 151, or may use both loads 151 and 155. In some embodiments, the circuit elements 152-154 in load 151 may be of the same type, arrangement, and values as the circuit elements 156-158 in load 155. However, in alternate embodiments, one or more circuit elements 152-154 in load 151 may be of a different type, a different arrangement, and/or a different value than the circuit elements 156-158 in load 155.

Note that the embodiment of probe 150 illustrated in FIG. 4 may be used with information that is communicated by way of a differential pair of signals that are coupled to probe contacts 160 and 161, respectively. For embodiments of probe 150 that are used with signals that are not transferred by way of a differential pair, but instead use a single conductor, it may only be necessary to implement one or more circuit elements illustrated on the right half, or alternately the left half, of probe 150.

In one embodiment, impedance 192 may be implemented as a resistance (e.g. approximately 100 ohms) to provide termination for a 100 ohm differential pair. A different resistance value may be used for other types of termination. In alternate embodiments, impedance 192 may comprise one or more resistive elements, one or more capacitive elements, and/or one or more inductive elements coupled in any desired and appropriate series or parallel configuration, having any desired and appropriate values, and used for any desired and appropriate function.

In one embodiment (e.g. a bias-T configuration), impedance 300 may be implemented as an inductor and impedance 301 may be implemented as a capacitor. The specific values of inductor 300 and capacitor 301 may be determined by the bias required by the device under test 110. Similarly, impedance 303 may be implemented as an inductor and impedance 302 may be implemented as a capacitor. The specific values of inductor 303 and capacitor 302 may be determined by the bias required by the device under test 110. In addition, for one embodiment, probe contact 310 may be coupled to a first approximately constant reference voltage and probe contact 311 may be coupled to a second approximately constant reference voltage. For one embodiment, the reference voltages coupled to probe contacts 310 and 311 may be the same and may be approximately ground.

In one embodiment (e.g. a SATA configuration), impedance 300 may be implemented as a capacitor and impedance 301 may be implemented as a resistor. The specific values of capacitor 300 and resistor 301 may be determined by the bias required by the device under test 110 or the SATA specification. Similarly, impedance 303 may be implemented as a capacitor and impedance 302 may be implemented as a resistor. The specific values of capacitor 303 and resistor 302 may be determined by the bias required by the device under test 110 or the SATA specification. In addition, for one embodiment, probe contact 310 may be coupled to a first approximately constant reference voltage. For one embodiment, the reference voltage coupled to probe contact 310 may be approximately ground.

In one embodiment (e.g. a pi filter configuration), impedance 300 may be implemented as a capacitor, impedance 301 may be implemented as an inductor, capacitor or as a resistor, and impedance 304 may be implemented as a capacitor. The specific values of capacitors 300 and 304 and resistor or inductor 301 may be determined by the bias required by the device under test 110. Similarly, impedance 303 may be implemented as a capacitor, impedance 302 may be implemented as an inductor or as a resistor, and impedance 305 may be implemented as a capacitor. The specific values of capacitors 303 and 305 and resistor or inductor 302 may be determined by the bias required by the device under test 110. In addition, for one embodiment, probe contact 310 may be coupled to a first approximately constant reference voltage and probe contact 311 may be coupled to a second approximately constant reference voltage. For one embodiment, the reference voltages coupled to probe contacts 310 and 311 may be approximately the same and may be approximately ground. Similarly, for one embodiment, probe contact 500 may be coupled to a third approximately constant reference voltage and probe contact 501 may be coupled to a fourth approximately constant reference voltage. For one embodiment, the reference voltages coupled to probe contacts 500 and 501 may be approximately the same and may be approximately ground.

In one embodiment (e.g. a rise time filter configuration), impedance 304 may be implemented as a capacitor and impedance 301 may be implemented as a resistor. The specific values of capacitor 304 and resistor 301 may be determined by the bias required by the device under test 110.

Similarly, impedance 305 may be implemented as a capacitor and impedance 302 may be implemented as a resistor. The specific values of capacitor 305 and resistor 302 may be determined by the bias required by the device under test 110.

Probe interface 162 may be used for properly terminating signals coming from the device under test 110. Probe interface 162 may also be used to interface the circuitry on probe 150 with other circuitry, such as, for example, amplifier 180 and test apparatus 182 (see FIG. 3). For example, if signals are being provided to the device under test 110 by way of probe interface 162, conductors 184 and 185 may provide a signal path to the device under test 110 by way of probe contacts 160 and 161.

Note that for some embodiments, probe interface 162 is uni-directional from device under test 110 to probe interface 162. For alternate embodiments, probe interface 162 is bi-directional, both from device under test 110 to probe interface 162 as well as from probe interface 162 to device under test 110. And for yet other embodiments, probe interface 162 is uni-directional from probe interface 162 to device under test 110.

The connectivity of the circuitry illustrated in FIG. 4 will now be described. In the illustrated embodiment, probe contact 160 is coupled to a first terminal of impedance 304 and to a first terminal of impedance 301. A second terminal of impedance 304 is coupled to a probe contact 500. Probe contact 500 may be coupled to a reference voltage. In one embodiment, the reference voltage coupled to probe contact 500 may be provided from the device under test 110 or from another portion of apparatus 170. A second terminal of impedance 301 is coupled to a first terminal of impedance 300. A second terminal of impedance 300 is coupled to a probe contact 310. Probe contact 310 may be coupled to a same reference voltage as probe contact 500, or may be coupled to a different reference voltage than probe contact 500. In one embodiment, the reference voltage coupled to probe contact 310 may be provided from the device under test 110 or from another portion of apparatus 170. In one embodiment, the reference voltage may be approximately ground.

In the illustrated embodiment, probe contact 161 is coupled to a first terminal of impedance 305 and to a first terminal of impedance 302. A second terminal of impedance 305 is coupled to a probe contact 501. Probe contact 501 may be coupled to a reference voltage. In one embodiment, the reference voltage coupled to probe contact 501 may be provided from the device under test 110 or from another portion of apparatus 170. A second terminal of impedance 302 is coupled to a first terminal of impedance 303. A second terminal of impedance 303 is coupled to a probe contact 311. Probe contact 311 may be coupled to a same reference voltage as probe contact 501, or may be coupled to a different reference voltage than probe contact 501. In one embodiment, the reference voltage coupled to probe contact 311 may be provided from the device under test 110 or from another portion of apparatus 170. In one embodiment, the reference voltage may be approximately ground. In some embodiments, an impedance 192 may have a first terminal coupled to the first terminal of impedance 300, and may have a second terminal coupled to the first terminal of impedance 303.

In the illustrated embodiment, probe contact 165 is coupled to a first terminal of impedance 152 and a first terminal of impedance 154. A second terminal of impedance 152 is coupled to a first terminal of impedance 153. And a second terminal of impedance 153 and a second terminal of impedance 154 are both coupled to a second terminal of impedance 301. Note that in the illustrated embodiment, load 151 comprises impedances 152-154. In alternate embodiments, load 151 may comprises any appropriate and desired number of impedances arranged in any appropriate and desired configuration. Probe contact 165 may be coupled to a reference voltage. In one embodiment, the reference voltage coupled to probe contact 165 may be provided from the device under test 110 or from another portion of apparatus 170. In one embodiment, the reference voltage may be approximately ground.

In the illustrated embodiment, probe contact 164 is coupled to a first terminal of impedance 158 and a first terminal of impedance 156. A second terminal of impedance 158 is coupled to a first terminal of impedance 157. And a second terminal of impedance 157 and a second terminal of impedance 156 are both coupled to a second terminal of impedance 302. Note that in the illustrated embodiment, load 155 comprises impedances 156-158. In alternate embodiments, load 155 may comprises any appropriate and desired number of impedances arranged in any appropriate and desired configuration. Probe contact 164 may be coupled to a reference voltage. In one embodiment, the reference voltage coupled to probe contact 164 may be provided from the device under test 110 or from another portion of apparatus 170. In one embodiment, the reference voltage may be approximately ground. Probe contact 164 may be coupled to a same reference voltage as probe contact 165, or may be coupled to a different reference voltage than probe contact 165.

Still referring to FIG. 4, probe 150 has a probe interface 162 which includes a resistor 190 coupled in series between probe contact 160 and a first conductor of the plurality of conductors 183. Probe interface 162 also includes a resistor 191 coupled in series between probe contact 161 and a second conductor of the plurality of conductors 183. Resistance 190 is used in conjunction with the impedance of a first conductor of the plurality of conductors 183 to achieve a desired impedance value (as viewed from probe contact 160) for the benefit of test apparatus 182 (see FIG. 3). Similarly, resistance 191 is used in conjunction with the impedance of a second conductor of the plurality of conductors 183 to achieve a desired impedance value (as viewed from probe contact 161) for the benefit of test apparatus 182. Note that neither resistor 190 nor resistor 191 can be used as part of the compliance load required by the PCI Express Base Specification. Wire or trace 184 is used on probe 150 to electrically couple probe contact 160 and conductors 183. Wire or trace 185 is used on probe 150 to electrically couple probe contact 161 and conductors 183. Note that probe 150 may have one or more intervening devices (e.g. 301, 190) between a probe contact (e.g. 160) and the conductors 183 to the test apparatus 182.

Note that the impedances illustrated in FIG. 4 may be any combination of electrical devices, such as, for example, a resistive element, a capacitive element, and/or an inductive element. Each resistive element, capacitive element, and/or inductive element may be implemented using one or more discrete devices, using one or more integrated devices, or using a combination of discrete and integrated devices. In addition, each impedance 192, 300-305, 152-154, 156-158 may be implemented by one or more resistive elements, capacitive elements, and/or inductive elements arranged in any appropriate and desired combination of series and/or parallel elements, having any appropriate and desired values.

Note that the structural support portion of probe 150 may be comprised of any desired and appropriate material or combination of materials, such as, for example, any material that is appropriate for use as or with a circuit board. As one possible example, probe 150 may comprise Teflon or FR4. Alternate embodiments of probe 150 may use any appropriate and desired one or more different materials.

By now it should be appreciated that there has been provided a test apparatus and device under test 170 (see FIG. 3) having a probe 150 that can be located very close to contact pads 144, 120-122 and that requires very few solder connections 145, 140-142. In addition (see FIG. 4), probe 150 can be configured to meet any appropriate and desired electrical specification while still using a same circuit board 143. Note that unlike FIG. 2 when a prior art probe 730 is used, there is no longer a need to attach discrete components to a circuit board (i.e. discrete components 23-26 soldered to circuit board 43 in FIG. 2). Thus, by using the configurable probe 150 of FIGS. 3 and 4, a single circuit board 143 may be used with multiple probes (e.g. 150) to test for compliance with a variety of different electrical specifications having different requirements. As illustrated in FIG. 3, it is now possible and comparatively simple from a soldering standpoint to reflow the solder connections 145, 140-142 and decouple probe 150 from device under test 110. It is then possible and comparatively simple from a soldering standpoint to couple a new probe (e.g. having a different configuration for a different electrical standard) to one or more of contact pads 144, 120-122 or to other contact pads (not shown) on circuit board 143. This results in a significant savings in cost, labor, and materials.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, although configurations for various probes 150 have been described herein, probe 150 may have any configuration of electrical elements on-board. In addition, referring to FIG. 4, probe 150 may comprise one or more additional elements (such as, for example, switches, fuses, programmable logic) that may be used to configure the circuitry on probe 150. Thus, probe 150 may be user configurable. Note also that the programmable circuitry (not shown) may be integrated on a same integrated circuit device on probe 150 as one or more of the impedances illustrated in FIG. 4 on probe 150. In addition, any dependent claim may alternately be dependent from any other appropriate claim. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

Additional Text

1. A method, comprising:
    providing a device under test for example (110) on a circuit board for example (143), wherein the device under test is electrically coupled to a plurality of conductive pads for example (120, 121, 122, 144) on the circuit board;
    providing a probe for example (150) having a first probe contact for example (160);
    providing an impedance for example (151) on the probe;
    providing a conductor for example (184) on the probe, wherein the conductor electrically couples the impedance to the first probe contact; and
    providing a conductive path for example (187, 140) between the first probe contact and a first one for example (120) of the plurality of conductive pads on the circuit board, wherein the conductive path is free of discrete resistors and is free of discrete capacitors.
2. A method as in statement 1, wherein the impedance for example (151) is coupled between the first probe contact for example (160) and a voltage reference for example (165).
3. A method as in statement 2, wherein the voltage reference is approximately ground.
4. A method as in statement 1, wherein the impedance has one or more values that are determined by a standards specification.
5. A method as in statement 4, wherein the standards specification comprises a PCI Express Base Specification.
6. A method as in statement 1, wherein a distance between two of the plurality of conductive pads for example (120, 121) is less than one millimeter.
7. A method as in statement 1, wherein a distance between two of the plurality of conductive pads for example (120, 121) is less than 0.5 millimeters.
8. A method as in statement 1, wherein a distance between two of the plurality of conductive pads for example (120, 121) is less than 0.5 millimeter.
9. A method as in statement 1, further comprising:
    providing a second probe contact for example (165) on the probe for example (150), wherein the impedance for example (151) is coupled between the first probe contact for example (160) and the second probe contact for example (165).

10. A method as in statement 9, wherein the second probe contact for example (165) is coupled to an approximately constant voltage during operation, and wherein the approximately constant voltage is approximately ground.

11. A method as in statement 9, further comprising:
providing a third probe contact for example (161) on the probe for example (150), wherein the first probe contact receives a first signal, wherein the second probe contact receives a second signal, and wherein the first signal and the second signal are differential signals.

12. An apparatus for example (170), comprising:
a probe for example (150), wherein the probe comprises:
a first probe contact for example (160);
a first impedance element for example (153 or 300) coupled between the probe contact for example (160) and a reference voltage for example (165 or 310), wherein the reference voltage for example (165 or 310) remains approximately constant during use of the probe; and
a second impedance element for example (152 or 301) coupled between the probe contact for example (160) and the first reference voltage for example (165 or 310).

13. An apparatus as in statement 12, wherein the first impedance element comprises a resistive element for example (153) and wherein the second impedance element comprises a capacitive element for example (152).

14. An apparatus as in statement 12, wherein the first impedance element and the second impedance element are coupled in series.

15. An apparatus as in statement 12, wherein the probe for example (150) further comprises:
a third impedance element for example (190) in series between the first probe contact for example (160) and a test apparatus for example (182).

16. An apparatus as in statement 12, wherein the probe for example (150) further comprises:
a second probe contact for example (161); and
a third impedance element for example (192) coupled between the first probe contact for example (160) and the second probe contact for example (161) and comprising a resistive element.

17. An apparatus as in statement 12, wherein the first impedance element comprises an inductive element for example (300) and wherein the second impedance element comprises a capacitive element for example (301).

18. An apparatus for example (170), comprising:
a device under test for example (110) on a circuit board for example (143), wherein the device under test is electrically coupled to a plurality of conductive pads for example (120, 121, 122, 144) on the circuit board;
a probe for example (150) comprising:
a first probe contact for example (160);
a first impedance for example (151, 300, 301, or 304);
a second impedance for example (190); and
a conductor for example (184),
wherein the conductor for example (184) electrically couples the first impedance for example (151, 300, 301, or 304) to the first probe contact for example (160), and
wherein the second impedance for example (190) is coupled between the first probe contact for example (160) and a test apparatus for example (182); and
a conductive path for example (187, 140) between the first probe contact and a first one for example (120) of the plurality of conductive pads on the circuit board, wherein the conductive path is free of discrete resistors and is free of discrete capacitors.

19. An apparatus as in statement 18, wherein the impedance for example (151) is coupled between the first probe contact for example (160) and a node for example (165), wherein the node is kept at a voltage of approximately ground during use of the probe for example (150).

20. A method as in statement 18, wherein the first impedance for example (151, 300, 301, or 304) has one or more values that are determined by a standards specification.

What is claimed is:

1. A method, comprising:
providing a device under test on a circuit board, wherein the device under test is electrically coupled to a plurality of conductive pads on the circuit board;
providing a probe having a first probe contact, a first impedance, and a second impedance;
providing a conductor on the probe, wherein the conductor electrically couples the first impedance to the first probe contact, and wherein the second impedance is coupled between the first probe contact and a test apparatus; and
providing a conductive path between the first probe contact and a first one of the plurality of conductive pads on the circuit board.

2. A method as in claim 1, wherein the first impedance is coupled between the first probe contact and a voltage reference.

3. A method as in claim 2, wherein the voltage reference is approximately ground.

4. A method as in claim 1, wherein the first impedance has one or more values that are determined by a standards specification.

5. A method as in claim 4, wherein the standards specification comprises a PCI Express Base Specification.

6. A method as in claim 1, wherein a distance between two of the plurality of conductive pads is less than one millimeter.

7. A method as in claim 1, wherein a distance between two of the plurality of conductive pads is less than 0.5 millimeters.

8. A method as in claim 1, wherein a distance between two of the plurality of conductive pads is less than 0.5 millimeter.

9. A method as in claim 1, further comprising:
providing a second probe contact on the probe, wherein the first impedance is coupled between the first probe contact and the second probe contact.

10. A method as in claim 9, wherein the second probe contact is coupled to an approximately constant voltage during operation, and wherein the approximately constant voltage is approximately ground.

11. A method as in claim 9, further comprising:
providing a third probe contact on the probe, wherein the first probe contact receives a first signal, wherein the second probe contact receives a second signal, and wherein the first signal and the second signal are differential signals.

12. An apparatus, comprising:
a probe, wherein the probe comprises:
a first probe contact;
a first impedance element coupled between the probe contact and a reference voltage, wherein the reference voltage remains approximately constant during use of the probe;
a second impedance element coupled between the probe contact and the first reference voltage;
a second probe contact; and
a third impedance element coupled between the first probe contact and the second probe contact and comprising a resistive element.

13. An apparatus as in claim 12, wherein the first impedance element comprises a resistive element and wherein the second impedance element comprises a capacitive element.

14. An apparatus as in claim 12, wherein the first impedance element and the second impedance element are coupled in series.

15. An apparatus as in claim 12, wherein the probe further comprises:
a third impedance element in series between the first probe contact and a test apparatus.

16. An apparatus as in claim 12, wherein the first impedance element comprises an inductive element and wherein the second impedance element comprises a capacitive element.

17. An apparatus, comprising:
a device under test on a circuit board, wherein the device under test is electrically coupled to a plurality of conductive pads on the circuit board;
a probe comprising:
a first probe contact;
a first impedance;
a second impedance; and
a conductor,
wherein the conductor electrically couples the first impedance to the first probe contact, and
wherein the second impedance is coupled between the first probe contact and a test apparatus; and
a conductive path between the first probe contact and a first one of the plurality of conductive pads on the circuit board.

18. An apparatus as in claim 17, wherein the first impedance is coupled between the first probe contact and a node, wherein the node is kept at a voltage of approximately ground during use of the probe.

19. A method as in claim 17, wherein the first impedance has one or more values that are determined by a standards specification.

* * * * *